United States Patent
Ahlstedt et al.

(10) Patent No.: US 7,981,712 B2
(45) Date of Patent: Jul. 19, 2011

(54) METHOD FOR PRODUCING AN OPTOELECTRONIC SEMICONDUCTOR CHIP, AND OPTOELECTRONIC SEMICONDUCTOR CHIP

(75) Inventors: Magnus Ahlstedt, Regensburg (DE); Lutz Höppel, Alteglofsheim (DE); Matthias Peter, Alteglofsheim (DE); Matthias Sabathil, Regensburg (DE); Uwe Strauss, Bad Abbach (DE); Martin Strassburg, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 140 days.

(21) Appl. No.: 12/011,458

(22) Filed: Jan. 25, 2008

(65) Prior Publication Data

US 2008/0203407 A1 Aug. 28, 2008

(30) Foreign Application Priority Data

Jan. 26, 2007 (DE) .......................... 10 2007 004 132
Apr. 23, 2007 (DE) .......................... 10 2007 019 079

(51) Int. Cl.
*H01L 21/00* (2006.01)
*H01L 29/22* (2006.01)
*H01L 21/28* (2006.01)
*H01L 33/00* (2010.01)

(52) U.S. Cl. ............ 438/47; 438/41; 438/606; 257/103; 257/E21.11

(58) Field of Classification Search .................... 438/41, 438/47, 606; 257/103
See application file for complete search history.

(56) References Cited

U.S. PATENT DOCUMENTS

| | | | |
|---|---|---|---|
| 5,834,326 A | 11/1998 | Miyachi et al. | |
| 6,020,602 A | 2/2000 | Sugawara et al. | |
| 6,526,082 B1 | 2/2003 | Corzine et al. | |
| 2002/0025661 A1 | 2/2002 | Nikolaev et al. | |
| 2003/0085409 A1 | 5/2003 | Shen et al. | |
| 2005/0173724 A1* | 8/2005 | Liu ............................ | 257/103 |
| 2005/0199904 A1 | 9/2005 | Yamamoto | |
| 2005/0221520 A1 | 10/2005 | Ou et al. | |
| 2005/0221526 A1 | 10/2005 | Cho et al. | |
| 2006/0054917 A1 | 3/2006 | Lee et al. | |
| 2006/0220057 A1* | 10/2006 | Shim et al. ................. | 257/103 |
| 2007/0096143 A1* | 5/2007 | Kim et al. .................. | 257/103 |

FOREIGN PATENT DOCUMENTS

DE 10 2005 035 722 2/2007

(Continued)

OTHER PUBLICATIONS

V. Kirilyuk et al., "Photoluminescence study of homoepitaxial N-polar GaN grown on differently misoriented single crystal substrates", Journal of Crystal Growth, vol. 230, pp. 477-480, 2001.

(Continued)

*Primary Examiner* — Fernando L Toledo
(74) *Attorney, Agent, or Firm* — Cohen Pontani Lieberman & Pavane LLP

(57) ABSTRACT

A method for producing an optoelectronic semiconductor chip based on a nitride semiconductor system is specified. The method comprises the steps of: forming a semiconductor section with at least one p-doped region; and forming a covering layer disposed downstream of the semiconductor section in a growth direction of the semiconductor chip, said covering layer having at least one n-doped semiconductor layer. An activation step suitable for electrically activating the p-doped region is effected before or during the formation of the covering layer. An optoelectronic semiconductor chip which can be produced by the method is additionally specified.

11 Claims, 7 Drawing Sheets

FOREIGN PATENT DOCUMENTS

| EP | 0 541 373 | 11/1992 |
|----|-----------|---------|
| EP | 1 755 173 | 8/2006 |
| JP | 2000-315858 | 11/2000 |
| WO | WO 2006/074916 | 7/2006 |

OTHER PUBLICATIONS

G. Martinez et al., "Study of inversion domain pyramids formed during the GaN:Mg growth", Solid-State Electronics, vol. 47, pp. 565-568, 2003.

P.R. Tavernier et al., "The growth of N-face GaN by MOCVD: effect of Mg, Si, and In", Journal of Crystal Growth, vol. 264, pp. 150-158, 2004.

J.L. Weyher et al., "Morphological and structural characteristics of homoepitaxial GaN grown by metalorganic chemical vapour deposition (MOCVD)", Journal of Crystal Growth, vol. 204, pp. 419-428, 1999.

A.R.A. Zauner et al., "Homo-epitaxial growth on the N-face of GaN single crystals: the influence of the misorientation on the surface morphology", Journal of Crystal Growth, vol. 240, pp. 14-21, 2002.

* cited by examiner

METHOD FOR PRODUCING AN OPTOELECTRONIC SEMICONDUCTOR CHIP, AND OPTOELECTRONIC SEMICONDUCTOR CHIP

RELATED APPLICATIONS

The present patent application claims the priorities of German Patent Application 102007004132.4 and 102007019079.6, the disclosure content of which is hereby incorporated by reference.

FIELD OF THE INVENTION

The application relates to a method for producing an optoelectronic semiconductor chip based on a nitride semiconductor system. The application additionally relates to an optoelectronic semiconductor chip based on a nitride semiconductor system.

BACKGROUND OF THE INVENTION

A method of this type or a semiconductor chip of this type is described for example in US 2003/0085409 A1.

SUMMARY OF THE INVENTION

It is an object to specify a method of the type mentioned in the introduction which makes it possible to produce an optoelectronic semiconductor chip with an improved efficiency. In addition, the intention is to specify an optoelectronic semiconductor chip with improved efficiency.

In the present context, "based on a nitride semiconductor system" means that the semiconductor chip has at least one layer which contains a material composed of the nitride semiconductor system. Preferably, an active region of the semiconductor chip is based on a nitride semiconductor system. The active region is suitable for generating electromagnetic radiation.

The term nitride semiconductor system encompasses all nitride compound semiconductor materials. A semiconductor structure composed of a binary, ternary and/or quaternary compound of elements of main group III with a nitride can be involved in this case. Examples of materials of this type are: BN, AlGaN, GaN, AlGaInN or further III-V compounds. The nitride semiconductor system is particularly preferably the III-V semiconductor material system $In_yGa_{1-x-y}Al_xN$ where $0 \leq x \leq 1$, $0 \leq y \leq 1$ and $x+y \leq 1$.

All the materials specified need not necessarily have a mathematically exact composition according to the formulae specified. Rather, they can have one or more dopants and additional constituents which essentially do not change the physical properties of the material. For the sake of simplicity, however, the formulae specified only comprise the essential constituents of the crystal lattice, even if these can be replaced in part by a small quantity of further substances.

A method is specified which comprises the steps of: forming a semiconductor section with at least one p-doped region; forming a covering layer disposed downstream of the semiconductor section in a growth direction of the semiconductor chip. An activation step suitable for electrically activating the p-doped region is effected before or during the formation of the covering layer.

The expression "during the formation of the covering layer" is taken to mean a period of time during which part of the covering layer has been formed, but the covering layer overall is still incomplete.

In accordance with one preferred embodiment, the covering layer terminates with a semiconductor layer or a layer with a transparent, electrically conductive oxide (transparent conductive oxide, TCO) in the growth direction, that is to say on a side remote from the semiconductor section. In accordance with this embodiment, possible layers of different type which are applied to the terminating layer of the covering layer or to the semiconductor chip do not belong to the covering layer. Examples of such layers of different type are electrically insulating passivation layers which are applied in particular to outer areas of the semiconductor chip, or metallic contact layers.

The activation step comprises a targeted feeding of energy to the semiconductor section. As a result, an activation of the p-doped region is realized at least to a required minimum extent, that is to say that a desirable increase in the p-type conductivity of a nominally p-conductive region is brought about.

In one embodiment, the activation step comprises a supply of heat over a time period of the order of magnitude by a number of minutes. The dopant for the p-doped region, that is to say at least one suitable acceptor, generally cannot be introduced into the semiconductor in a pure form. Instead, the dopant is present in a complex with at least one further substance. Said further substance often acts as a donor for the semiconductor material, which compensates for the acceptor in terms of its electrical effect. The activation step is suitable for permanently producing the electrical effect of at least some of the acceptors within the semiconductor material, that is to say that it is suitable for increasing the p-type conductivity. This can be obtained by supplying energy, in particular by supplying heat. The p-type conductivity can be activated in this way. Particularly preferably, the dopant for the p-doped regions has magnesium. The magnesium is generally incorporated into the semiconductor material in a complex with hydrogen. The activation step produces the electrical effect of at least part of the magnesium as a p-type dopant, which is compensated for by the hydrogen.

The covering layer is disposed downstream of the semiconductor section in a growth direction of the semiconductor chip. That is to say that, as seen from a growth substrate of the semiconductor chip, there follow firstly the semiconductor section and after that the covering layer. The semiconductor section is thus arranged spatially closer to the growth substrate than the covering layer.

It is also possible to strip the growth substrate from the layers deposited thereon. It is correspondingly possible for the growth substrate to be stripped away in the case of the optoelectronic semiconductor chip. Nevertheless, even a semiconductor chip with the growth substrate stripped away has a growth direction; the reference side is then not the side at which the growth substrate is arranged, but rather the side at which the growth substrate was arranged and was stripped away.

The growth direction can often also be determined on the basis of the orientation of the grown crystal structure.

Semiconductor materials from the III-V semiconductor material system $In_yGa_{1-x-y}Al_xN$ having a zinc blended structure essentially composed of two fcc lattices ("face centered cubic" lattice) that are displaced with respect to one another. One fcc lattice has the N atoms and the other fcc lattice contains the remaining atom types. The position of the origin of one of the lattices is displaced along the spatial diagonals in components of the base vectors by (¼, ¼, ¼) with respect to the other lattice.

The growth direction also essentially runs along one direction of the spatial diagonals, i.e. in the (1,1,1) direction or in the (−1, −1, −1) direction. In such a direction there follow planes with densely packed N atoms (N-plane or N-face) and planes with the remaining atom types in a dense packing (called Ga-plane or Ga-face for the sake of simplicity). In one direction, the distance between the Ga-plane and the N-plane is approximately three times as much as the distance between the N-plane and the Ga-plane. This direction is also called "Ga-face up" in the technical jargon. Semiconductor materials from the III-V semiconductor material system $In_yGa_{1-x-y}Al_xN$ are normally grown "Ga-face up". However, it is also possible, in principle, to grow the materials "N-face up", that is to say in an opposite direction or order relative to the lattice structure. In this direction, the distance between the N-plane and the Ga-plane is approximately three times as much as the distance between the Ga-plane and the N-plane. However, special measures are generally necessary in order to grow the materials "N-face up", that is to say with an opposite structure sequence.

Carrying out an activation step before or during the formation of the covering layer promotes the outdiffusion of undesirable elements—which are contained together with the dopant in the semiconductor material—from the p-doped regions. It was established that an improved activation can be realized with an activating step at a time while the formation of the covering layer had not yet been begun or else had already been begun but had not yet been ended. Semiconductor chips having a low forward voltage $U_f$ can thereby be obtained.

In one expedient embodiment, no material for the covering layer is applied during the activation step. If the activation step is effected during the formation of the covering layer, then the application of material for the covering layer is expediently interrupted during the activation step. This can mean that no material for the covering layer is applied during the activation step, or that a growth rate at which the covering layer is formed is significantly reduced during the activation step. A minimum growth rate for the formation of the covering layer is set for example during the activation step.

The covering layer is advantageously free of p-doped semiconductor material. However, this does not rule out the fact that p-type dopants, that is to say acceptors, can be present in the semiconductor material of the covering layer. Rather, the expressions "p-doped" or "n-doped" are taken to mean a nominal doping in each case. In particular, acceptors have to significantly outweigh donors in the case of a p-doped material, and the situation is reversed in the case of an n-doped material.

The n-doped semiconductor layer in the covering layer is expediently formed with a thickness of greater than 5 nm, preferably with a thickness of greater than 10 nm, particularly preferably with a thickness of greater than 20 nm. Particularly advantageously, the n-doped semiconductor layer can also be formed with even significantly larger thicknesses. This is taken to mean thicknesses of greater than 50 nm, preferably of greater than 100 nm. Thicknesses of greater than 500 nm are likewise possible. n-doped semiconductor layers having a large thickness have a high transverse conductivity and bring about an advantageous current spreading in the semiconductor chip to be produced.

Forming the semiconductor section and the covering layer expediently comprises epitaxial growth of semiconductor material. In accordance with a further embodiment, the activation step is preferably carried out during an interruption of the epitaxial growth.

Particularly preferably, the activation step is effected before the n-doped semiconductor layer is formed or while the n-doped semiconductor layer is incompletely formed. In this case, the incompletely formed semiconductor layer advantageously has a thickness of less than or equal to 20 nm, preferably of less than or equal to 10 nm, particularly preferably of less than or equal to 5 nm.

It was surprisingly established that an n-doped semiconductor layer, compared with a nominally undoped semiconductor layer, has a particularly obstructive effect for the activation of the p-doped region.

If the activation step is carried out while a relatively thick n-doped layer of the covering layer has already been formed, then the activation is inhibited. The consequence of this is that a smaller number of free charge carriers are contained in the p-doped region. In this case, the term "free charge carriers" also encompasses in particular holes, that is to say sites at which electrons are absent and which are crucially responsible for the conductivity in p-doped semiconductors.

In accordance with at least one further embodiment, forming the covering layer comprises forming a current spreading layer with a transparent, electrically conductive oxide (transparent conductive oxide, TCO). Said current spreading layer is expediently disposed downstream of the n-doped semiconductor layer of the covering layer in the growth direction. The current spreading layer preferably adjoins the n-doped semiconductor layer.

It was established that n-doped semiconductor layers can be contacted-connected particularly well by means of current spreading layers having a transparent, electrically conductive oxide. The current spreading layer has the advantage that an effective current spreading can be realized without particularly thick n-doped semiconductor layers being required. In this embodiment, the activation step can expediently be effected after the semiconductor material of the covering layer has been formed. Advantageously, forming the covering layer comprises epitaxial growth of semiconductor material and the activation step is effected after the epitaxial growth.

In a further embodiment, applying the n-doped semiconductor material comprises the use of at least one hydrogen-free coating and growth method. Applying the n-doped semiconductor material advantageously comprises molecular beam epitaxy (MBE). This is advantageous particularly when the formation of semiconductor material of the covering layer is interrupted for carrying out the activation step. Molecular beam epitaxy is an epitaxy method in which generally no free hydrogen radicals are contained in the growth atmosphere. Such free hydrogen radicals or other correspondingly charged impurities and/or impurity complexes are disadvantageous, however, since they compensate for free charge carriers of the p-doped region and therefore at least partly reverse the activation of the p-doped region. In accordance with a further embodiment, applying the n-doped semiconductor material additionally or alternatively comprises sputtering.

Forming the n-doped semiconductor layer additionally or alternatively comprises metal organic vapor phase epitaxy (MOVPE). In this case, materials of the nitride semiconductor system are particularly advantageously grown using nitrogen sources which do not produce any free hydrogen radicals during the growth.

In one expedient embodiment, the covering layer is formed in such a way that a spacer layer with nominally undoped semiconductor material is arranged between the n-doped semiconductor layer and the semiconductor section. In one configuration, the spacer layer has a thickness of 1 nm to 100 nm inclusive, preferably of 2 nm to 10 nm inclusive.

The semiconductor section preferably has a p-doped barrier layer for an active region of the semiconductor chip which is suitable for generating electromagnetic radiation. The active region is advantageously arranged between the barrier layer and the covering layer. As an alternative, the barrier layer is arranged between the active region and the covering layer, that is to say that the active region is arranged upstream of the barrier layer in the growth direction.

An optoelectronic semiconductor chip based on a nitride semiconductor system is specified. It has a semiconductor section with at least one p-doped region, and also a covering layer, wherein the covering layer is disposed downstream of the semiconductor section in a growth direction of the semiconductor chip. The covering layer has at least one n-doped semiconductor layer. The p-doped region has a charge carrier concentration or dopant concentration of at least $5 \cdot 10^{17}$ cm$^{-3}$. The p-doped region preferably has a charge carrier concentration or dopant concentration of at least $10^{18}$ cm$^{-3}$, particularly preferably of at least $10^{19}$ cm$^{-3}$.

In accordance with one expedient embodiment, the covering layer is closed, that is to say that it has, in particular, essentially no perforations. However, the covering layer can be partially removed, for example in order to uncover semiconductor layers disposed upstream of the covering layer in the growth direction for the purpose of electrical contact connection. The covering layer advantageously covers a large part of the semiconductor section in the growth direction in a closed form. The covering is, in particular, such that it is suitable for significantly impeding or inhibiting an activation step.

Particularly preferably, the n-doped semiconductor layer has a thickness of greater than 5 nm. This thickness should be understood as a minimum thickness, that is to say that, in accordance with this embodiment, the n-doped semiconductor layer has essentially no regions which have a thickness of 5 nm or less. Particularly advantageously, the n-doped semiconductor layer has a thickness of greater than 10 nm, preferably of greater than 20 nm, particularly preferably of greater than 50 nm. It can advantageously also have an even larger thickness, such as, for instance, a thickness of greater than 100 nm or of greater than 500 nm. The larger the thickness of the n-doped semiconductor layer, the better generally the current spreading which can be obtained by it.

In accordance with at least one embodiment, the n-doped semiconductor layer is closed. It is advantageously formed in such a way that it is suitable for significantly impeding or inhibiting an activation step for the semiconductor chip.

The covering layer of the semiconductor chip advantageously has a spacer layer with nominally undoped semiconductor material. In this case, the semiconductor material has essentially no dopants or dopants in such a low concentration that it is referred to as undoped by a person skilled in the art. The spacer layer is arranged between the n-doped semiconductor layer and the semiconductor section.

In a further embodiment, the covering layer of the semiconductor chip has a layer with a transparent, electrically conductive oxide (transparent conductive oxide, TCO). Said layer is expediently disposed downstream of the n-doped semiconductor layer in a growth direction of the semiconductor chip.

In accordance with a particularly advantageous embodiment, the semiconductor section has a p-doped barrier layer for an active region of the semiconductor chip, wherein the active region is suitable for generating an electromagnetic radiation. The active region is arranged between the barrier layer and the covering layer. As an alternative, the active region is disposed upstream of the barrier layer in a growth direction of the semiconductor chip, that is to say that the barrier layer is arranged between the active region and the covering layer.

The semiconductor chip advantageously has an electrical forward voltage $U_f$ of less than or equal to 5 V, preferably of less than or equal to 4.5 V, particularly preferably of less than or equal to 4 V, in each case measured at an electric current of 20 mA. Such a low forward voltage can be realized with at least one embodiment of the method.

The optoelectronic semiconductor chip is particularly advantageously produced in accordance with at least one embodiment of the method.

DETAILED DESCRIPTION OF THE DRAWINGS

In the exemplary embodiments and the figures, identical or identically acting constituent parts are in each case provided with the same reference symbols. The elements illustrated and also the size relationships of the elements among one another should not necessarily be regarded as true to scale. Moreover, some details of the figures are illustrated with an exaggerated size in order to afford a better understanding.

Figure 1:
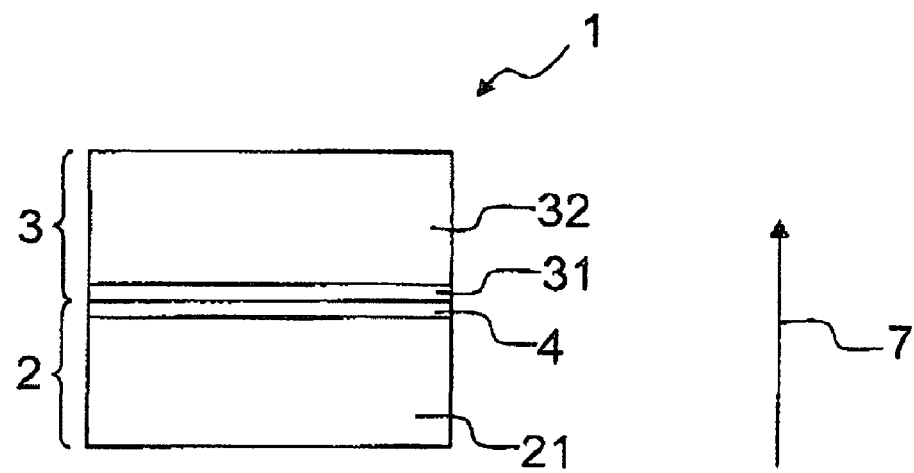
FIG. 1 shows a schematic side view of an optoelectronic semiconductor chip in accordance with the first exemplary embodiment.

The semiconductor chip illustrated in FIG. 1 has a semiconductor section 2 and a covering layer 3. The covering layer 3 is disposed downstream of the semiconductor section 2 in the growth direction 7. The semiconductor section 2 contains a p-doped layer 21 and also an active layer 4. The active layer 4 has at least one active region suitable for generating electromagnetic radiation. The p-doped layer 21 is a barrier layer for the active region of the active layer 4. The p-doped layer 21 is part of a p-doped region of the semiconductor section 2. Part of the active layer 4 is likewise p-doped.

The covering layer 3 has a nominally undoped spacer layer 31 and also an n-doped semiconductor layer 32. The n-doped semiconductor layer 32 is disposed downstream of the nominally undoped layer 31 in the growth direction 7.

The semiconductor chip 1 illustrated in FIG. 1 terminates with the covering layer in the growth direction, that is to say that the covering layer or the n-doped layer 32 of the covering layer 3 is an outer layer. The semiconductor chip 1 can be electrically conductively contact-connected for example by means of a metallic contact material, but this is not illustrated in FIG. 1. Moreover, the semiconductor chip 1 in accordance with the exemplary embodiment illustrated in FIG. 1 can comprise further layers and regions that are not illustrated in FIG. 1. Thus, it is possible for the semiconductor chip 1 to have a substrate which is arranged on a side of the semiconductor section 2 which is remote from the covering layer 3.

The semiconductor chips 1 illustrated in the rest of the figures can also have in each case a growth substrate which is disposed upstream of the illustrated part of the semiconductor chip 1 in the growth direction 7. A growth substrate 6 of the semiconductor chip 1 is illustrated in the case of the exemplary embodiment illustrated in FIG. 9. Substrates used can be n-doped or p-doped electrically conductive substrates based on, for example, GaN, SiC or Si(111). However, it is also possible, in principle, for an electrically nonconductive substrate, for example based on sapphire and/or AlN, to be used.

A growth substrate is required for forming semiconductor layers of the semiconductor chip 1. The semiconductor layers are formed by means of epitaxial growth, that is to say of epitaxy. It is possible, for example, for the growth substrate to be thinned or completely removed. The semiconductor chip 1 can then be fixed on a carrier for example by its surface which faces in the growth direction 7. Such a carrier, which is not illustrated in any of the figures, does not change anything about the growth direction 7 of the semiconductor chip. The growth direction runs from a side of the semiconductor chip 1 on which a growth substrate is arranged or was arranged to a side on which the covering layer is arranged. By way of example, semiconductor materials from the III-V semiconductor material system $In_yGa_{1-x-y}Al_xN$ are grown "Ga-face up". The carrier can be adapted better, with regard to its coefficient of thermal expansion, to the grown layers than an original growth substrate.

The semiconductor layers of the semiconductor chip 1 are preferably all based on $In_yGa_{1-x-y}Al_xN$ where $0 \leq x \leq 1$, $0 \leq y \leq 1$ and $x+y \leq 1$. Silicon, for example, is suitable as an n-type dopant. Magnesium, for example, is used as a p-type dopant.

The active layer 4 contains for example a conventional pn junction, a double heterostructure, a single quantum well structure (SQW structure) or a multiple quantum well structure (MQW structure). The active layer preferably contains a multiple quantum well structure. Structures of this type are known to the person skilled in the art and are therefore not explained in any greater detail at this juncture.

Figure 2:
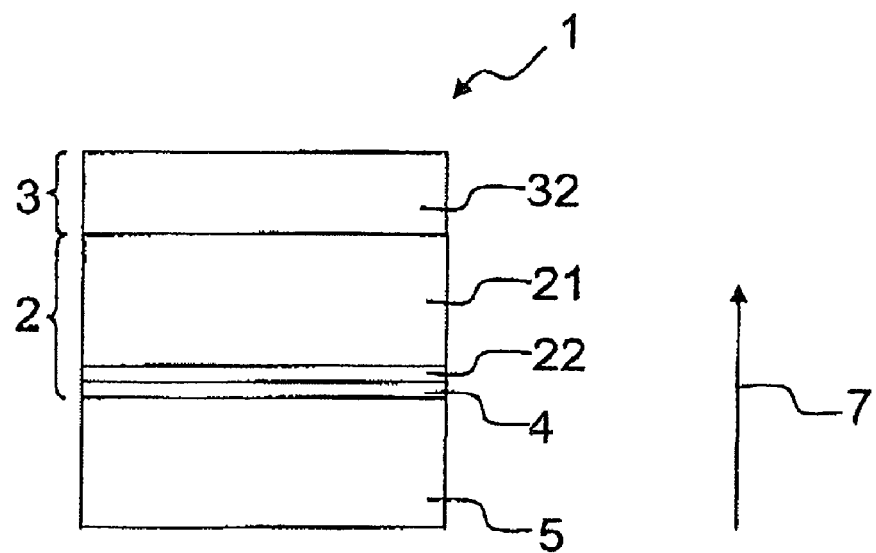
FIG. 2 shows a schematic side view of an optoelectronic semiconductor chip in accordance with the second exemplary embodiment.

While in the case of the semiconductor chip 1 illustrated in FIG. 1, the active layer 4 is arranged on a side of the semiconductor section 2 which faces the covering layer 3, this is not the case in the semiconductor chip 1 illustrated in FIG. 2. Here, the active layer 4 is arranged on a side of the semiconductor section 2 which is remote from the covering layer 3. In growth direction 7, proceeding from the active layer 4, the semiconductor section 2 of the semiconductor chip 1 additionally has a nominally undoped spacer layer 22 and a p-doped layer 21.

The covering layer 3 adjoins the semiconductor section 2 in the growth direction. It comprises for example a single n-doped semiconductor layer 32. As an alternative, the covering layer can also have a plurality of different layers.

The semiconductor chip 1 described with reference to FIG. 1 has an inverted polarity compared with conventional semiconductor chips based on a nitride semiconductor system. That is to say that in conventional semiconductor chips, the covering layer would generally not have an n-doped semiconductor layer, but instead a p-doped semiconductor layer. Likewise, in a conventional semiconductor chip, an n-doped layer would be formed instead of the p-doped layer 21.

It was established that an inverted polarity of the semiconductor chip can lead to a significant improvement of the internal quantum efficiency. In conventional semiconductor chips, the internal quantum efficiency decreases greatly as the density of the current being pressed into the semiconductor chip increases. By contrast, what can be achieved in the case of a semiconductor chip having inverted polarity is that the internal quantum efficiency is significantly less dependent on the intensity of the impressed current. Ideally, the internal quantum efficiency of the semiconductor chip is virtually independent of the current density.

By contrast, in terms of its construction the semiconductor chip 1 illustrated in FIG. 2 essentially corresponds to a conventional semiconductor chip having customary polarity. It contains in growth direction 7 in succession an n-doped layer 5, an active layer 4 and a p-doped layer 21. A nominally undoped spacer layer 22, for example, can be arranged between the active layer and the p-doped layer 21.

While conventional semiconductor chips generally terminate with a p-doped layer in the growth direction 7, however, the semiconductor chip illustrated in FIG. 2 has the covering layer 3 with the n-doped semiconductor layer 32. An improved current spreading can be realized by means of the covering layer 3 compared with conventional semiconductor chips. p-doped semiconductor materials based on a nitride semiconductor system have a poorer transverse conductivity than n-doped layers based on such a material system. The thickness of the n-doped semiconductor layer 32 is 120 nm, for example. As a result, alongside the improved current spreading, in addition an improved coupling out of electromagnetic radiation from the semiconductor chip can also be obtained. The n-doped semiconductor layer therefore also functions for example as an advantageous coupling-out layer. In the case of a semiconductor chip which emits blue light, the thickness of the n-doped semiconductor layer 32 is approximately 140 nm, for example. In the case of a semiconductor chip which emits green light, the thickness of the n-doped semiconductor layer 32 is approximately 150 nm, for example.

Figure 3:
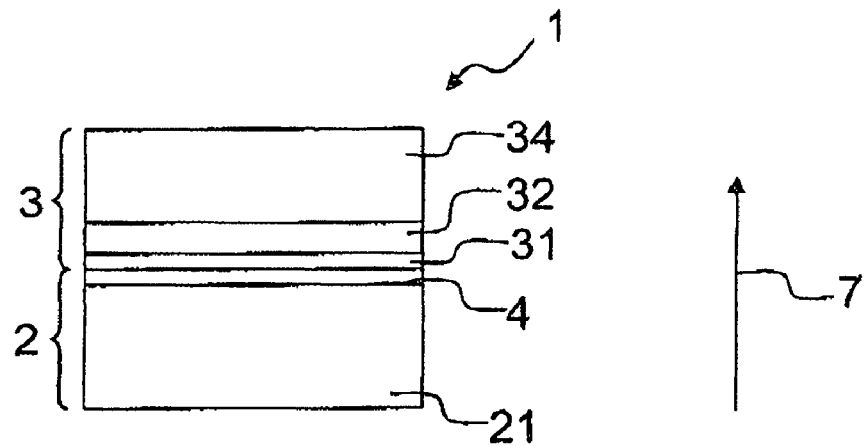
FIG. 3 shows a schematic side view of an optoelectronic semiconductor chip in accordance with the third exemplary embodiment.
Figure 4:
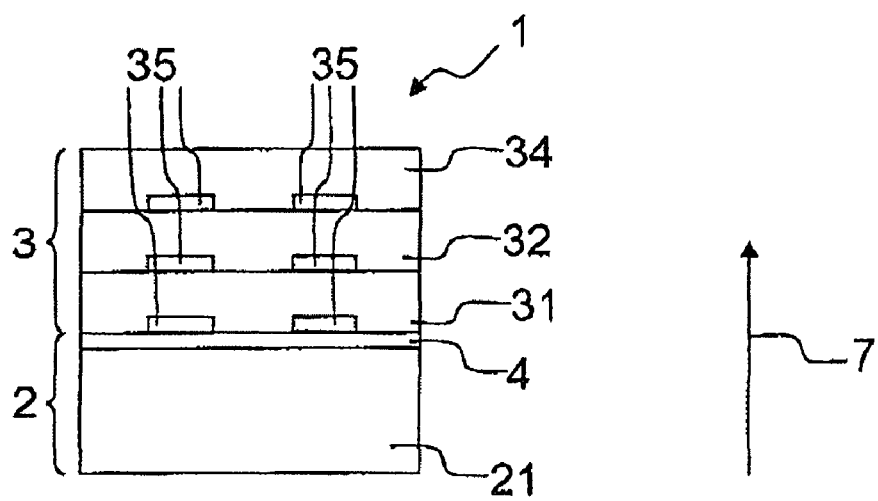
FIG. 4 shows a schematic side view of an optoelectronic semiconductor chip in accordance with the fourth exemplary embodiment.

The semiconductor chips 1 illustrated in FIGS. 3 and 4 correspond, in terms of their polarity, to the semiconductor chip 1 explained previously with reference to FIG. 1. In contrast to the semiconductor chip illustrated with reference to FIG. 1, a current spreading layer 34 is additionally contained in the covering layer 3 in the case of the semiconductor chips illustrated in FIGS. 3 and 4. The current spreading layer 34 has a transparent, electrically conductive oxide (TCO) or it essentially comprises a TCO.

Materials based on, for example, tin oxide, indium oxide, indium tin oxide or zinc oxide are suitable as TCO. The current spreading layer 34 essentially comprises indium tin oxide, for example. It has e.g. a thickness of 500 nm. Current spreading layers of this type can be applied particularly well on n-doped semiconductor layers.

The n-doped semiconductor layer 32 can be formed with a significantly smaller thickness in the case of the semiconductor chips 1 illustrated in FIGS. 3 and 4 than in the case of the semiconductor chip illustrated in FIG. 1, in order to realize a comparable or even better current spreading. The thickness of the n-doped semiconductor layer 32 is for example only between 5 and 15 nm; for example, the thickness is approximately 10 nm.

In the case of the semiconductor chip 1 illustrated in FIG. 4, in contrast to the semiconductor chip illustrated in FIG. 3, current barriers 35 are integrated in the covering layer 3. A current barrier 35 can be formed for example at least one of the following positions: between the active layer 4 and the nominally undoped spacer layer 31; between the spacer layer 31 and the n-doped semiconductor layer 32; between the n-doped semiconductor layer 32 and the current spreading layer 34. Any desired combinations are possible, in principle, with regard to the position or the number of current barriers.

The current barriers 35 have for example an electrically insulating material such as silicon dioxide, for instance. During the production of the semiconductor chip, e.g. a thin insulation layer is applied over the area on a semiconductor layer. The insulation layer is subsequently patterned, that is to say that it is partially removed again. This can be done by means of a lithographic process.

A desired current distribution in the semiconductor chip can be realized in a targeted manner by means of the current barriers. During operation of the semiconductor chip, the current density is significantly reduced in regions which are laterally shaded by a current barrier. The current carrying and the generation of electromagnetic radiation can thus largely be restricted to regions from which the generated light can be coupled out from the semiconductor. By way of example, light cannot be coupled out at surface regions which are covered with a largely radiation-opaque material, for example a metal.

Figure 5:
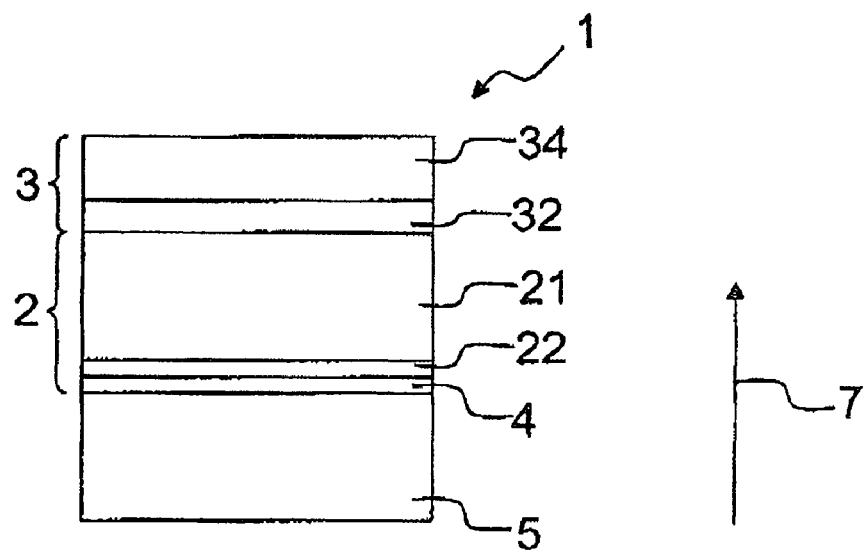
FIG. 5 shows a schematic side view of an optoelectronic semiconductor chip in accordance with the fifth exemplary embodiment.
Figure 6:
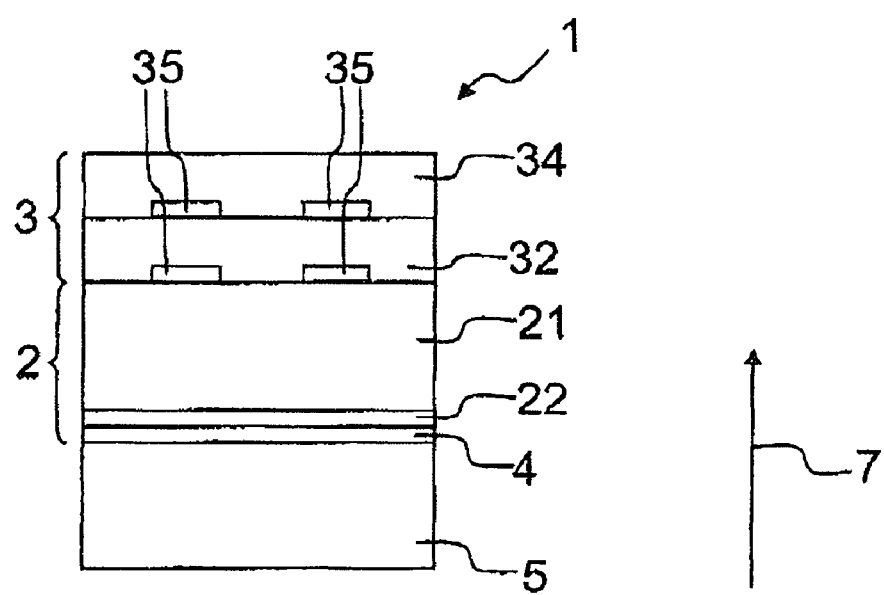
FIG. 6 shows a schematic side view of an optoelectronic semiconductor chip in accordance with the sixth exemplary embodiment.

The semiconductor chips illustrated in FIGS. 5 and 6 have essentially the construction of the semiconductor chip 1 described previously with reference to FIG. 2. One difference is that the covering layer 3 additionally has a current spreading layer 34. The current spreading layer 34 can be constituted analogously to the current spreading layer 34 described previously in connection with FIGS. 3 and 4.

Analogously to the semiconductor chip illustrated with reference to FIG. 4, the semiconductor chip illustrated in FIG. 6 also has at least one current barrier 35 in the covering layer. Preferably, a plurality of current barriers are contained. Current barriers can be arranged between the p-doped semiconductor layer 21 and the nominally undoped spacer layer 32 and/or between the spacer layer 32 and the n-doped semiconductor layer 34. The current barriers 35 can be produced and constituted analogously to the current barriers described previously in connection with FIG. 4.

Figure 7:
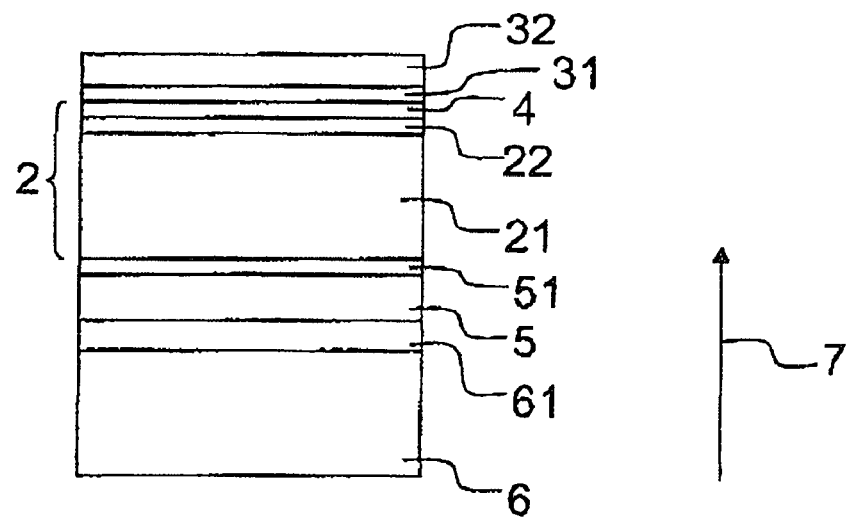
FIG. 7 shows a schematic side view of an incomplete luminescence diode chip in accordance with a seventh exemplary embodiment during a method stage of a first exemplary embodiment of the method.

FIG. 7 illustrates an incomplete semiconductor chip during a method stage of an exemplary embodiment of the method. The incomplete semiconductor chip has in growth direction 7 in succession a growth substrate 6, a buffer layer 61, an n-doped semiconductor layer 5, a tunnel contact 51, a semiconductor section 2, a spacer layer 31 and also an n-doped semiconductor layer 32.

The semiconductor section 2 has in the growth direction a p-doped semiconductor layer 21, a spacer layer 22 and also an active layer 4. The n-doped semiconductor layer 32 is incomplete, that is to say that the epitaxial growth of the n-doped semiconductor layer 32 was interrupted.

An activation step is carried out during the interruption. The interruption is effected while the n-doped semiconductor layer 32 still has a small thickness of less than or equal to 20 nm. By way of example, the n-doped semiconductor layer 32 has a thickness of approximately 5 nm at the point in time of the interruption. As an alternative, the interruption can also be effected before the formation of the n-doped semiconductor layer 32 has been begun. By way of example, the interruption can advantageously be effected after the active layer 4 has been formed and before the formation of the spacer layer 31 is begun.

The activation step has for example a time period of 6 to 15 minutes. The activation step typically lasts approximately 8 minutes. The activation is carried out for example at a temperature of between 500° C. and 800° C. inclusive. This can be effected at a constant temperature. As an alternative, however, it is also possible to vary the temperature during the activation.

Figure 8:
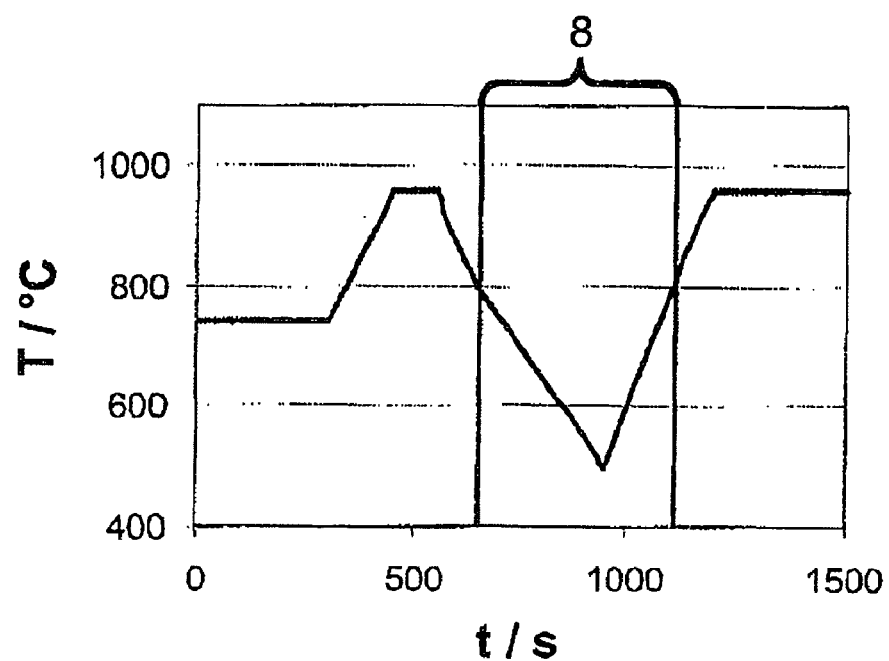
FIG. 8 shows a temperature-time diagram for illustrating the temperature profile during the method in accordance with the first exemplary embodiment.
Figure 9:
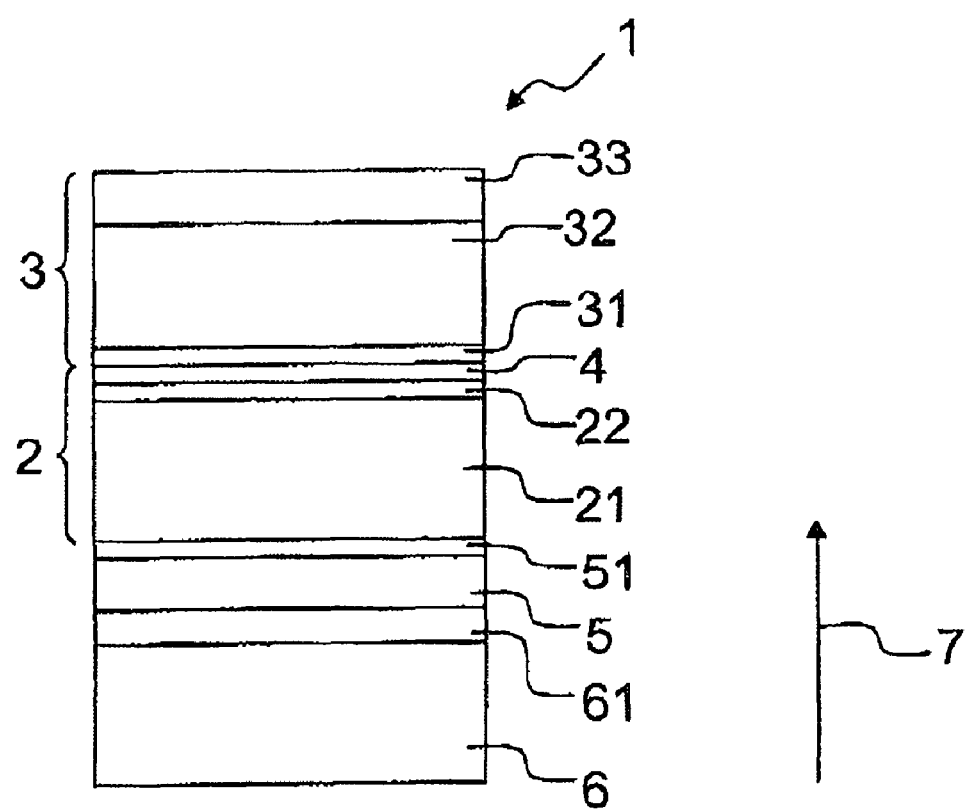
FIG. 9 shows a schematic side view of the complete optoelectronic semiconductor chip in accordance with the seventh exemplary embodiment.

FIG. 8 illustrates by way of example a temperature profile during the growth of the semiconductor layers for the semiconductor chip illustrated in FIGS. 7 and 9. A temperature of at least approximately 750° C. and at most approximately 950° C. or approximately 970° C. prevails during the epitaxial growth of the semiconductor layers.

The activation of the p-doped regions of grown semiconductor layers is effected during a time period 8. During said time period 8, the temperature is reduced, starting from approximately 800° C., to approximately 500° C. and is subsequently increased again to approximately 800° C. The increasing and reducing of the temperature are effected continuously, for example. They can also be effected in stepwise fashion. As an alternative, the temperature can also remain constant at least during part of the time period 8. After the time period 8, epitaxial growth of semiconductor layers is continued.

As an alternative, it is also possible to carry out the activation step only after the conclusion of the epitaxial growth. This is preferably the case when the covering layer 3 is intended to be formed with a current spreading layer with TCO. The activation is then effected before the formation of the current spreading layer with TCO.

The epitaxial growth of the n-doped semiconductor layer is effected e.g. by means of molecular beam epitaxy (MBE). This is an epitaxy method in which generally no free hydrogen radicals are contained in the growth atmosphere. MBE methods for growing nitride semiconductor materials are known to the person skilled in the art.

As an alternative, forming the n-doped semiconductor layer 32 comprises metal organic vapor phase epitaxy (MOVPE), e.g. the n-doped semiconductor layer 32 is grown epitaxially by means of MOVPE. For this purpose, e.g. dimethylhydrazine is advantageously used as a nitrogen source. This produces essentially no free hydrogen radicals during the growth. Free hydrogen radicals should be avoided since they are suitable for at least partly reversing the activation of the p-doped regions.

The semiconductor chip 1 illustrated in incomplete form in FIG. 7 is represented schematically in a completed form in FIG. 9. After the activation step, the n-doped semiconductor layer 32 is formed further up to a thickness of, for example, approximately 120 nm. As an alternative, the n-doped layer 32 is formed with a thickness of 300 nm or more.

An $n^+$-doped semiconductor layer 33 is disposed downstream of the n-doped semiconductor layer 32 in growth direction 7. Said semiconductor layer 33 has a significantly higher dopant concentration than the n-doped semiconductor layer 32. By way of example, the doping concentration for the $n^+$-doped semiconductor layer 33 is at least $10^{20}$ cm$^{-3}$. The $n^+$-doped semiconductor layer 33 has a thickness of 5 nm, for example.

The n-doped semiconductor layer 5, the p-doped semiconductor layer 21 and the n-doped semiconductor layer 32 are for example all based on GaN or essentially comprise GaN. The n+-doped semiconductor layer 33 is based for example on InGaN or essentially comprises a material of this type. It goes without saying that suitable dopants are implemented in each case. Silicon, for example, is suitable as an n-type dopant, and magnesium, for example, is suitable as a p-type dopant.

The p-doped semiconductor layer 21 preferably has a thickness of between 50 nm and 500 nm; by way of example, the thickness is approximately 100 nm. The p-doped semiconductor layer 21 serves as a p-type barrier layer for the active region of the active layer 4.

A tunnel contact 51 succeeds the n-conducting semiconductor layer 5 as seen in growth direction 7. The tunnel contact 51 is preferably a highly doped n-p tunnel junction. In this case, the n-doped side of the tunnel contact 51 faces the n-conducting semiconductor layer 5. The p-doped side is remote from the n-conducting semiconductor layer 5. On its side facing the n-conducting semiconductor layer 5, the tunnel contact 51 comprises a highly n-doped $In_yGa_{1-x-y}Al_xN$ layer where $0 \leq x \leq 1$, $0 \leq y \leq 1$ and $x+y \leq 1$ or an n-doped $In_yGa_{1-x-y}Al_xN$ superlattice where $0 \leq x \leq 1$, $0 \leq y \leq 1$ and $x+y \leq 1$. Silicon, for example, is suitable as an n-type dopant. The doping concentration is preferably at least $10^{19}$, particularly preferably at least $10^{20}$. The highly n-doped layer is preferably at most 20 nm thick.

On the side remote from the n-conducting semiconductor layer 5, the tunnel contact 51 comprises for example a highly p-doped $In_yGa_{1-x-y}Al_xN$ layer where $0 \leq x \leq 1$, $0 \leq y \leq 1$ and $x+y \leq 1$ or a highly p-doped $In_yGa_{1-x-y}Al_xN$ superlattice where $0 \leq x \leq 1$, $0 \leq y \leq 1$ and $x+y \leq 1$. A possible p-type dopant is magnesium in this case. The doping concentration is preferably at least $10^{19}$, particularly preferably at least $10^{20}$. The highly p-doped layer is preferably at most 20 nm thick.

In this exemplary embodiment, preferably, an n-conducting substrate serves as growth substrate 6. Possible n-conducting substrates are in this case: n-GaN, n-SiC, n-Si(111). However, it is also possible for an electrically nonconductive substrate such as sapphire, for example, to be used.

In this case, the growth substrate 6 can have a slight disorientation, which can prove to be advantageous with regard to the crystal quality of the growing layers. The disorientation of the growth substrate 6 is preferably between 0.2° and 0.5°, for example 0.3°. Such a disorientation can lead to significantly smoother layers with reduced island growth and reduced roughness. The roughness of the growing layers can therefore be significantly reduced.

A buffer layer 61 follows the growth substrate 6 as seen in growth direction 7. Said buffer layer is based on a suitable nitride semiconductor material, for example AlN.

Figure 10:
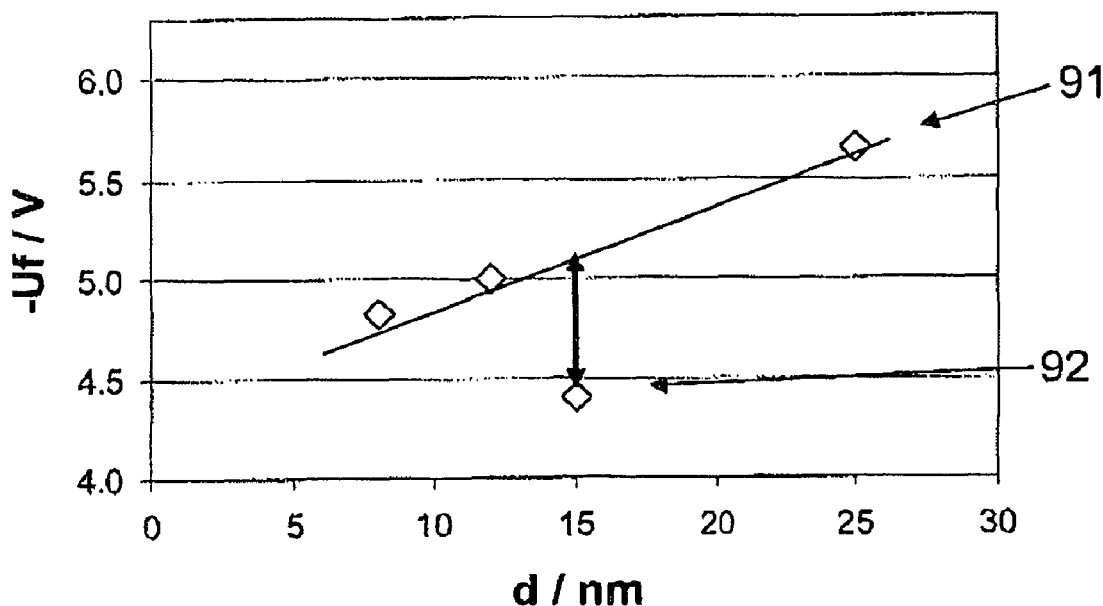
FIGS. 10 to 12 show diagrams for illustrating the forward voltage $U_f$ as a function of the thickness of layers of the covering layer during activation for optoelectronic semiconductor chips in accordance with different embodiments.

FIG. 10 plots the forward voltage for various semiconductor chips which are essentially constructed like the semiconductor chip 1 described previously with reference to FIG. 1. The forward voltage $U_f$ is plotted as a function of the thickness d of the nominally undoped spacer layer 31. It was measured with an electric current of approximately 20 mA being applied to the semiconductor chips. Referring to FIG. 1, during the measurements use was made of semiconductor chips whose n-doped semiconductor layer 32 is highly doped, that is to say that it has a doping concentration of more than $10^{19}$ cm$^{-3}$. In the case of the semiconductor chips, the activation step for activating the p-doped regions was not carried out until after all the semiconductor layers had been completely formed.

In the case of the three measurement results 91 arranged along the straight line, the n-doped semiconductor layer has a thickness of approximately 5 nm. It is evident that the resulting forward voltage $U_f$ depends linearly on the thickness of the spacer layer 31. In the case of the semiconductor chip whose measurement produced the measurement point 92, the activation step was carried out before the formation of the n-doped semiconductor layer 32. It was surprisingly possible to establish that, by means of this measure, the forward voltage $U_f$ can be significantly reduced compared with the other semiconductor chips. Although the nominally undoped spacer layer 31 had a thickness of approximately 15 nm when carrying out the activation step, a forward voltage $U_f$ of less than 4.5V could be realized overall.

Figure 11:
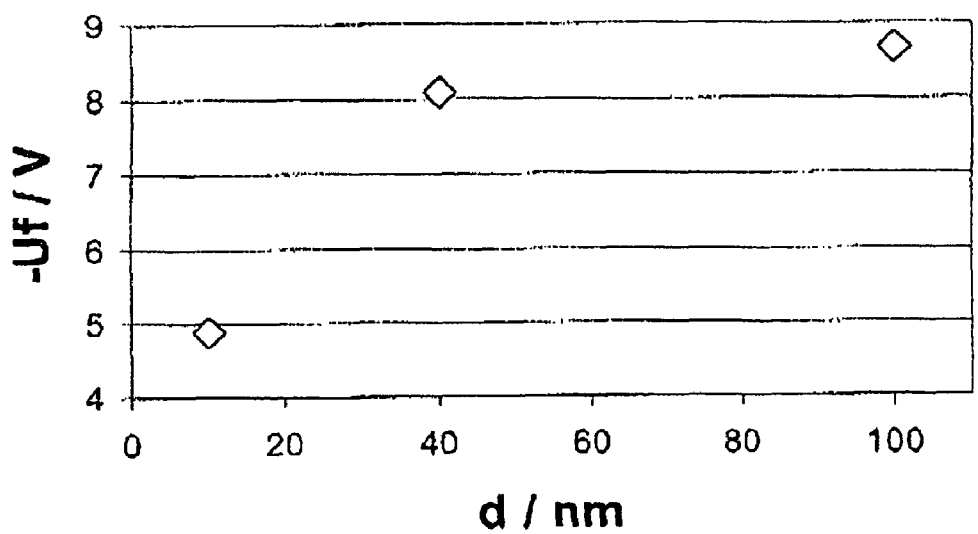

FIG. 11 likewise illustrates measurement results from the measurement of semiconductor chips of the type as illustrated in FIG. 1. The resulting forward voltage $U_f$ is plotted as a function of the thickness of the n-doped semiconductor layer 32. The activation step was effected in each case only after the n-doped semiconductor layer 32 had been completely formed.

It can be discerned that the resulting forward voltage $U_f$, up to thicknesses of approximately 40 nm, is very greatly dependent on the thickness of the n-doped semiconductor layer 32. If, during the activation step, an n-conducting semiconductor layer 32 having a thickness of approximately 40 nm is formed in the covering layer, the resulting forward voltage $U_f$ is more than 8 V. Such a high forward voltage $U_f$ is disadvantageous for commercial applications.

Figure 12:
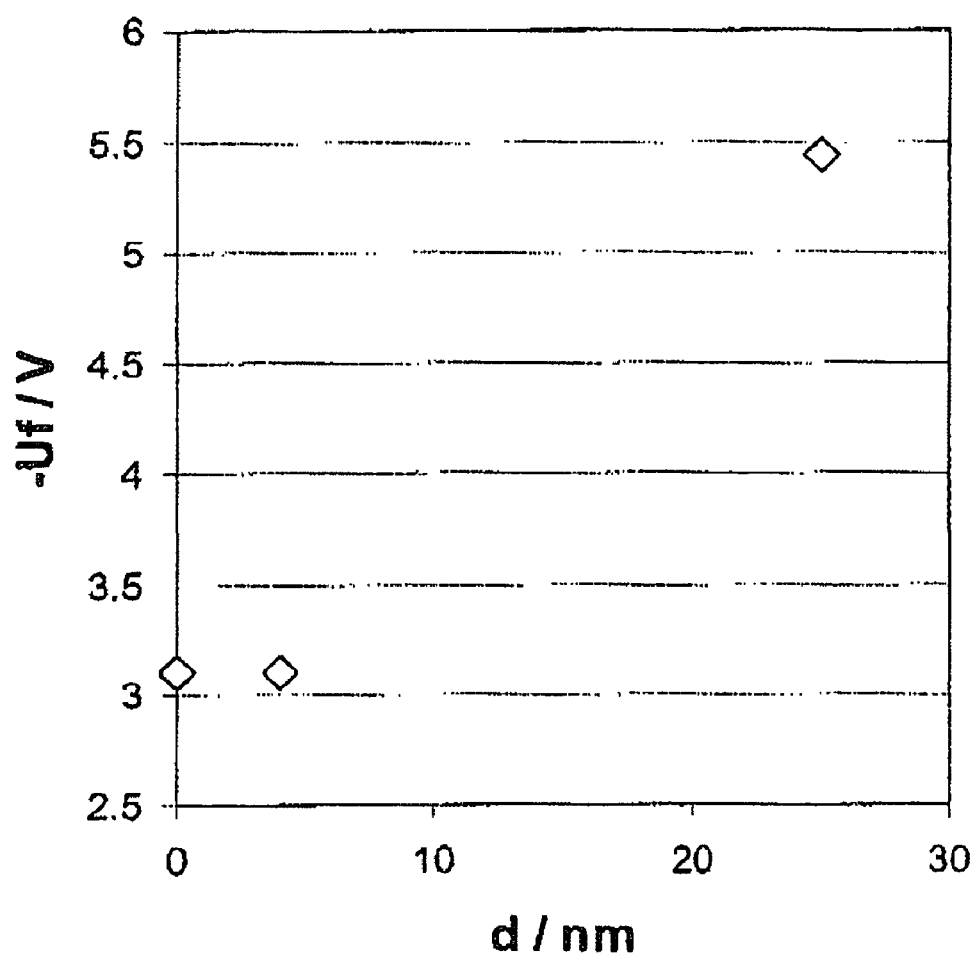

FIG. 12 illustrates the results of measurements similar to those in FIG. 11. One difference is that the measurements are carried out on semiconductor chips 1 embodied in the manner as described previously with reference to FIG. 2. In FIG. 12, too, it can be discerned that the resulting forward voltage $U_f$ is greatly dependent on the thickness of the n-doped semiconductor layer 32 which was present during the activation step.

By contrast, forward voltages of less than 4.5 V, preferably of less than 4 V can be realized with the method described.

In one embodiment, the semiconductor chip generally has in order: a first n-doped layer, a p-doped layer, an active layer with active zone, a second n-doped layer. In each case even further layers can be arranged between the layers specified and also before or after the outer layers. The respective layers can also be composed in each case of a plurality of sub layers. The semiconductor section with a p-doped region comprises the p-doped layer. The active layer can contain for example n-type dopants and/or p-type dopants e.g. Si and/or Mg. Either the first or the second n-doped layer is disposed downstream of the p-doped layer in the growth direction and thus part of the covering layer.

The first n-doped layer has, for example, a thickness of greater than or equal to 100 nm, but the thickness can also be smaller in other embodiments. The n-doped layer can also be a TCO layer. The p-doped layer has for example a thickness of greater than or equal to 50 nm.

The invention is not restricted to the exemplary embodiments by the description on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:
1. A method for producing an optoelectronic semiconductor chip based on a nitride semiconductor system, comprising the steps of:
    forming a semiconductor section with at least one p-doped region, and
    forming a covering layer disposed downstream of the semiconductor section in a growth direction of the semicon- ductor chip, said covering layer being free of p-doped semiconductor material and having at least one n-doped semiconductor layer,
wherein an activation step suitable for electrically activating the p-doped region is effected before or during the formation of the covering layer,
wherein forming the semiconductor section and the covering layer comprises epitaxial growth of a semiconductor material and the activation step is effected during an interruption of the epitaxial growth.

2. The method as claimed in claim 1, wherein the n-doped semiconductor layer is formed with a thickness of >20 nm.

3. The method as claimed in claim 1, wherein the activation step is effected before the n-doped semiconductor layer is formed or while the n-doped semiconductor layer is incompletely formed with a thickness of $\leq 20$ nm.

4. The method as claimed in claim 3, wherein the activation step is effected while the n-doped semiconductor layer is incompletely formed with a thickness of $\leq 5$ nm.

5. The method as claimed in claim 1, wherein forming the covering layer comprises forming a current spreading layer with a transparent, electrically conductive oxide and the activation step is effected before the current spreading layer is formed.

6. The method as claimed in claim 5, wherein forming the covering layer comprises epitaxial growth of semiconductor material and the activation step is effected after the epitaxial growth.

7. The method as claimed in claim 1, wherein forming the n-doped semiconductor layer comprises molecular beam epitaxy.

8. The method as claimed in claim 1, wherein forming the n-doped semiconductor layer comprises metal organic vapor phase epitaxy, using nitrogen sources which do not produce any free hydrogen radicals during the growth.

9. The method as claimed in claim 1, wherein the covering layer is formed in such a way that a spacer layer with nominally undoped semiconductor material is arranged between the n-doped semiconductor layer and the semiconductor section.

10. A method for producing an optoelectronic semiconductor chip based on a nitride semiconductor system, comprising the steps of:
forming a semiconductor section with at least one p-doped region, and
forming a covering layer disposed downstream of the semiconductor section in a growth direction of the semiconductor chip, said covering layer being free of p-doped semiconductor material and having at least one n-doped semiconductor layer,
wherein an activation step suitable for electrically activating the p-doped region is effected before or during the formation of the covering layer,
wherein the activation step is effected before the n-doped semiconductor layer is formed or while the n-doped semiconductor layer is incompletely formed with a thickness of $\leq 20$ nm, and
wherein the activation step is effected while the n-doped semiconductor layer is incompletely formed with a thickness of $\leq 5$ nm.

11. A method for producing an optoelectronic semiconductor chip based on a nitride semiconductor system, comprising the steps of:
forming a semiconductor section with at least one p-doped region, and
forming a covering layer disposed downstream of the semiconductor section in a growth direction of the semiconductor chip, said covering layer being free of p-doped semiconductor material and having at least one n-doped semiconductor layer,
wherein an activation step suitable for electrically activating the p-doped region is effected before or during the formation of the covering layer, and
wherein the covering layer is formed in such a way that a spacer layer with nominally undoped semiconductor material is arranged between the n-doped semiconductor layer and the semiconductor section.

* * * * *